(12) United States Patent
Chou et al.

(10) Patent No.: US 7,245,490 B2
(45) Date of Patent: Jul. 17, 2007

(54) SCREW-FREE FAN BRACKET MOUNTING STRUCTURE

(75) Inventors: Yi-Lung Chou, Taipei (TW); Chia-Kang Wu, Taipei (TW); Yu-Jen Liang, Taipei (TW)

(73) Assignee: Tatung Co., Ltd., Taipei (TW)

( * ) Notice: Subject to any disclaimer, the term of this patent is extended or adjusted under 35 U.S.C. 154(b) by 385 days.

(21) Appl. No.: 11/067,692

(22) Filed: Mar. 1, 2005

(65) Prior Publication Data

US 2005/0243513 A1 Nov. 3, 2005

(30) Foreign Application Priority Data

Apr. 28, 2004 (TW) .............. 93206521 U

(51) Int. Cl.
*H05K 7/20* (2006.01)
(52) U.S. Cl. .................. 361/695; 361/694; 454/184
(58) Field of Classification Search ........... 361/694, 361/695; 454/184
See application file for complete search history.

(56) References Cited

U.S. PATENT DOCUMENTS

| 4,517,880 A * | 5/1985 | Buckner et al. ............ 454/184 |
|---|---|---|
| 4,834,615 A * | 5/1989 | Mauch et al. ............. 415/213.1 |
| 5,136,465 A * | 8/1992 | Benck et al. .............. 361/687 |
| 5,186,605 A * | 2/1993 | Tracy ......................... 601/2 |
| 5,208,730 A * | 5/1993 | Tracy ......................... 361/687 |
| 5,717,570 A * | 2/1998 | Kikinis ....................... 361/685 |
| 5,788,566 A * | 8/1998 | McAnally et al. ......... 454/184 |
| 5,969,941 A * | 10/1999 | Cho ........................... 361/687 |
| 6,031,719 A * | 2/2000 | Schmitt et al. ............ 361/695 |
| 6,183,214 B1 * | 2/2001 | Ko ............................. 417/360 |
| 6,236,564 B1 * | 5/2001 | Fan ............................ 361/695 |
| 6,244,953 B1 * | 6/2001 | Dugan et al. .............. 454/184 |
| 6,313,989 B1 * | 11/2001 | Kuang ....................... 252/63.9 PZ |
| 6,315,656 B1 * | 11/2001 | Pawlowski ................. 454/184 |
| 6,322,042 B1 * | 11/2001 | Nemec ........................ 248/694 |
| 6,351,380 B1 * | 2/2002 | Curlee et al. ............. 361/695 |
| 6,373,698 B1 * | 4/2002 | Christensen ............... 361/695 |
| 6,556,437 B1 * | 4/2003 | Hardin ....................... 361/687 |
| 6,717,814 B2 * | 4/2004 | Li ............................... 361/704 |
| 6,826,048 B1 * | 11/2004 | Dean et al. ................ 361/695 |
| 7,002,796 B2 * | 2/2006 | Lao et al. .................. 361/695 |
| 7,145,771 B2 * | 12/2006 | Wang ......................... 361/695 |
| 2003/0147213 A1 * | 8/2003 | Syring et al. .............. 361/695 |
| 2003/0228840 A1 * | 12/2003 | Gough et al. .............. 454/184 |

(Continued)

FOREIGN PATENT DOCUMENTS

JP 03274795 A * 12/1991

*Primary Examiner*—Anatoly Vortman
(74) *Attorney, Agent, or Firm*—Bacon & Thomas, PLLC

(57) ABSTRACT

A screw-free fan bracket mounting structure includes a base frame mounted inside the case of a computer and a fan bracket fastened to the base frame for holding a cooling fan, the fan bracket having a top protruding block, a retaining block and a bottom hook, the base frame having an upper coupling hole, a retaining hole and a lower coupling hole for receiving the top protruding block, retaining block and bottom hook of the fan bracket respectively. The distance between the retaining block and bottom hook of the fan bracket is slightly greater than the distance between the retaining hole and lower coupling hole of the base frame so that the fan bracket is slightly compressed to produce an amount of plastic deformation and secured firmly to the base frame with an elastic force during installation.

4 Claims, 2 Drawing Sheets

U.S. PATENT DOCUMENTS

2004/0201962 A1* 10/2004 Lao et al. .................. 361/695
2005/0227608 A1* 10/2005 Wu et al. .................. 454/184
2005/0237712 A1* 10/2005 Li .............................. 361/687

* cited by examiner

SCREW-FREE FAN BRACKET MOUNTING STRUCTURE

BACKGROUND OF THE INVENTION

1. Field of the Invention

The present invention relates to a support for use in a computer or the like to support a fan and more specifically, to a screw-free fan bracket mounting structure.

2. Description of Related Art

A computer has many internal component parts, for example, a CPU, hard disk drive, etc. that produce heat when running. Cooling fans are commonly used in computers for causing a convection current of air to dissipate heat, thereby maintaining high system stability. A server is generally equipped with a quantity of cooling fans so that when one cooling fan fails, the others keep functioning whereby the maintenance engineer can repair the damaged cooling fan without shutting down the server.

In most computer servers, cooling fans are installed in a fan holder formed of a base frame and a plurality of fan brackets. When repairing one cooling fan, the maintenance engineer must detach the respective fan bracket from the base frame. However, because the fan brackets are fastened to the base frame with screws, it takes too much time to disconnect one fan bracket from the base frame.

SUMMARY OF THE INVENTION

The present invention has been accomplished under the circumstances in view. It is therefore the main object of the present invention to provide a fan bracket mounting structure, which can be easily detached and assembled without the use of screws.

To achieve this and other objects of the present invention, the fan bracket mounting structure comprises at least one fan bracket, each fan bracket comprising a top protruding block, a retaining block and a bottom hook respectively extended from an upright wall thereof at different elevations. The retaining block has a transverse retaining edge. The bottom hook has a transverse body section perpendicularly outwardly extended from a bottom side of the upright wall and a vertical body section perpendicularly downwardly extended from a distal end of the transverse body section. The transverse body section has a transverse bottom face, and the transverse retaining edge of the retaining block and the transverse face of the bottom hook defining a first distance. A base frame is fixedly mounted inside the case of a computer, and comprising a vertical panel and at least one coupling structure situated at the vertical panel and adapted to receive the at least one fan bracket respectively. Each coupling structure comprises an upper coupling hole, a retaining hole and a lower coupling hole adapted to receive the top protruding block, retaining block and bottom hook of one the fan bracket respectively. The retaining hole has a top edge for frictional engagement with the transverse retaining edge of the retaining block of one of the fan brackets. The lower coupling hole has a bottom edge for frictional engagement with the transverse face of the transverse body section of the bottom hook of one the fan bracket. The bottom edge of the lower coupling hole and the top edge of the retaining hole define a second distance, and the second distance being smaller than the first distance.

In general, by means of the material elastic recovery force of the fan bracket and the design of the distance between the retaining block and the bottom hook to be slightly greater than the distance between the retaining hole and the lower coupling hole, the fan bracket is firmly secured to the base frame.

DETAILED DESCRIPTION OF THE PREFERRED EMBODIMENT

Figure 1:
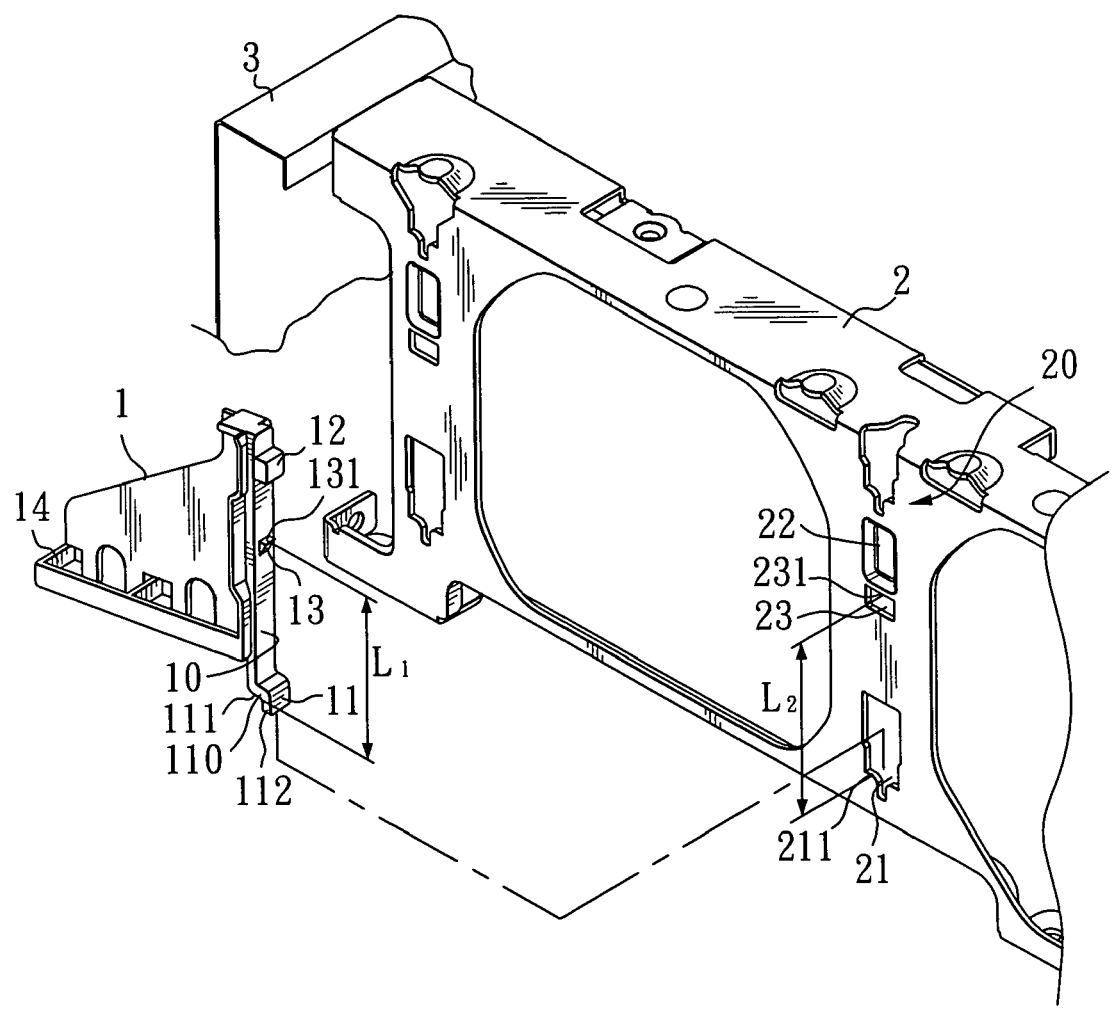
FIG. 1 is an exploded view of the preferred embodiment of the present invention.

Referring to FIG. 1, a fan bracket mounting structure in accordance with the present invention is shown comprised of a base frame 2 and at least one fan bracket 1.

The fan bracket 1 comprises an upright wall 10, a top protruding block 12 projecting from the upright wall 10 near the top, a bottom hook 11 extended from the bottom side of the upright wall 10, and a retaining block 13 projecting from the upright wall 10 on the middle between the top protruding block 12 and the bottom hook 11. The retaining block 13 is a wedge block having a transverse retaining edge 131. The bottom hook 11 is an angled plate having a transverse body section 110 perpendicularly outwardly extended from the bottom side of the upright wall 10 and a vertical body section 112 perpendicularly downwardly extended from the distal end of the transverse body section 110. The transverse body section 110 has a transverse face 111 at the bottom side. A first distance L1 is defined between the transverse retaining edge 131 of the retaining block 13 and the transverse face 111 of the bottom hook 11.

The base frame 2 is fixedly mounted inside the case 3 of a computer (not shown), comprising a vertical panel 20, and at least one coupling structure adapted to receive the at least one fan bracket 1 respectively. Each coupling structure of the base frame 2 comprises an upper coupling hole 22, a lower coupling hole 21, and a retaining hole 23 respectively arranged corresponding to the top protruding block 12, bottom hook 11 and retaining block 13 of each fan bracket 1. The retaining hole 23 is partially defined by a top edge 231. The lower coupling hole 21 has a bottom edge 211. A second distance L2 is defined between the bottom edge 211 defining the lower coupling hole 21 and the top edge 231 defining the retaining hole 23. The first distance L1 is slightly greater than the second distance L2.

Figure 2:
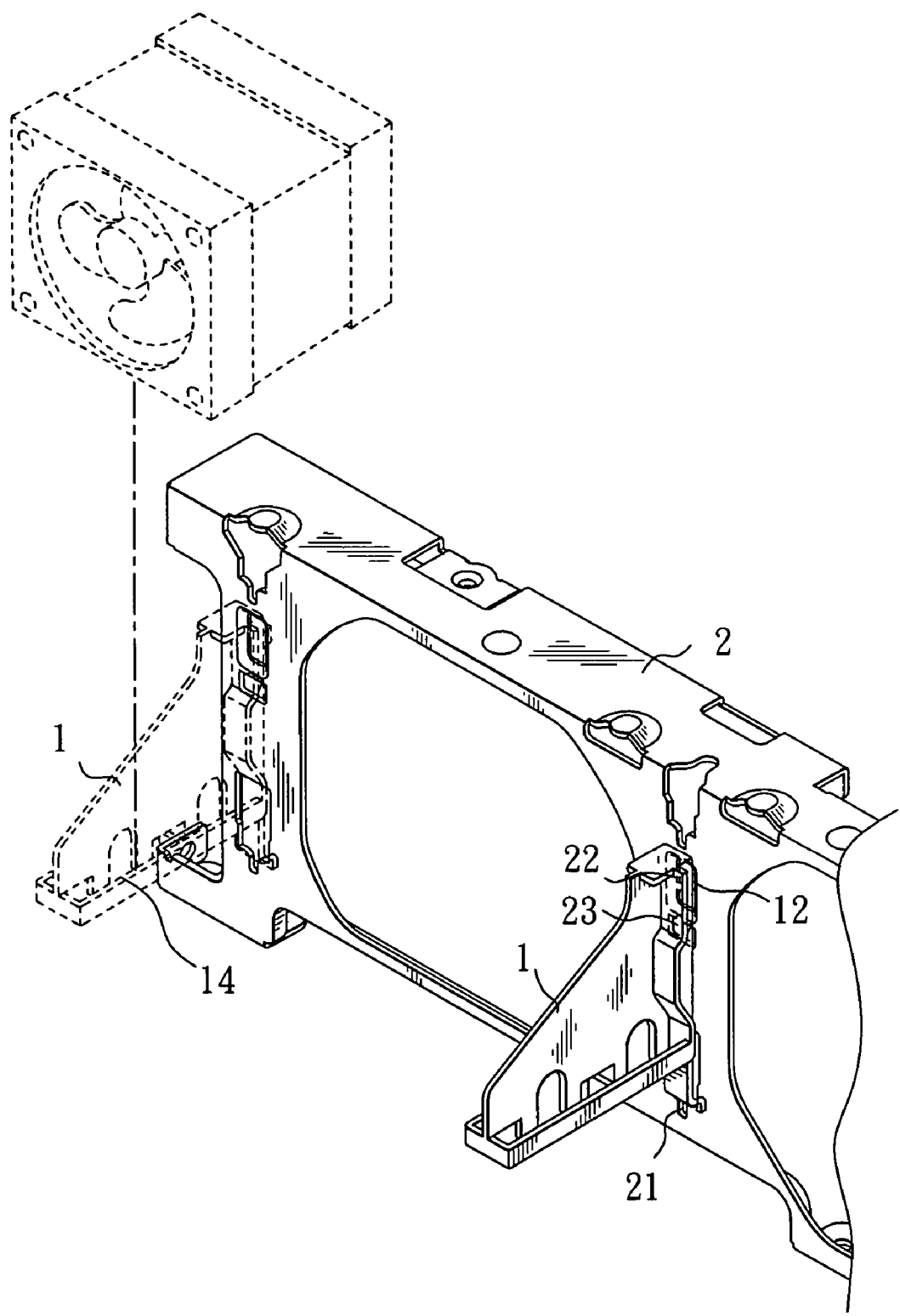
FIG. 2 is an assembly view of the preferred embodiment of the present invention.

Referring to FIG. 2 and FIG. 1 again, during installation, the vertical body section 112 of the bottom hook 11 of the fan bracket 1 is inserted into the lower coupling hole 21 of one coupling structure of the base frame 2 to press the transverse face 111 of the transverse body section 110 on the bottom edge 211 of the lower coupling hole 21, and then the top protruding block 12 and the retaining block 13 are respectively forced into the upper coupling hole 22 and retaining hole 23 of the respective coupling structure of the base frame 2 to have the transverse retaining edge 131 of the retaining block 13 pressed on the top edge 231 defining the retaining hole 23. Therefore, the fan bracket 1 is slightly compressed to produce an amount of plastic deformation, and secured firmly to the base frame 2 with an elastic force.

As indicated above, the main feature is the design of the first distance L1 to be slightly greater than the second distance L2. Thus, when fastening one fan bracket 1 to the base frame 2, the bottom hook 11 is hooked in the lower coupling hole 21 of one coupling structure of the base frame 2, and then a downward pressure is applied to the fan bracket 1 to force the retaining block 13 into engagement with the retaining hole 23. At this time, the fan bracket 1 is compressed by the user to reduce the first distance L1 to the extent about equal or even smaller than the second distance L2. When the user releases hand pressure from the fan bracket 1, the material elastic recovery force immediately returns the fan bracket 1 to the former shape to force the transverse retaining edge 131 of the retaining block 13 and the transverse face 111 of the transverse body section 110 into frictional engagement with the top edge 231 defining the retaining hole 23 and the bottom edge 211 defining the lower coupling hole 21 respectively. At the same time, the top protruding block 12 is engaged into the upper coupling hole 22. Therefore, the fan bracket 1 is firmly secured to the base frame 2.

Referring to FIGS. 1 and 2 again, the fan bracket 1 comprises a fan support 14 perpendicularly extended from the upright wall 10 for supporting a fan 4.

When the fan bracket 1 is to be removed from the base frame 2, the retaining block 13 is pushed forward from the back side of the base frame 2 to disengage the retaining block 13 from the retaining hole 23, and the user can then remove the bracket 1 from the base frame 2 easily.

As indicated above, the fan bracket can easily and quickly be fastened to the base frame without the use of screws or external fastening elements. Detaching the bracket from the base frame is also easy without the use of any hand tool.

Further, the retaining block can be made having any of a variety of shapes. Preferably, the retaining block is a wedge block. The fan bracket can be made of any of a variety of materials. Preferably, elastic plastic material is used for making the fan bracket. The base frame can be made of any of a variety of materials. Preferably, metal is used for making the base frame.

Although the present invention has been explained in relation to its preferred embodiment, it is to be understood that many other possible modifications and variations can be made without departing from the spirit and scope of the invention as hereinafter claimed.

What is claimed is:

1. A fan bracket mounting structure mounted inside a case of a computer, comprising:

at least one fan bracket, each said fan bracket comprising a top protruding block, a retaining block and a bottom hook respectively extended from an upright wall thereof at different elevations, said retaining block having a transverse retaining edge, said bottom hook having a transverse body section perpendicularly outwardly extended from a bottom side of said upright wall and a vertical body section perpendicularly downwardly extended from a distal end of said transverse body section, said transverse body section having a transverse bottom face, said transverse retaining edge of said retaining block and said transverse face of said bottom hook defining a first distance; and a base frame fixedly mounted inside the case of a computer, said base frame comprising a vertical panel and at least one coupling structure situated at said vertical panel and adapted to receive said at least one fan bracket respectively, each said coupling structure comprising an upper coupling hole, a retaining hole and a lower coupling hole adapted to receive the top protruding block, retaining block and bottom hook of one said fan bracket respectively, said retaining hole being partially defined by a top edge for frictional engagement with the transverse retaining edge of the retaining block of one said fan bracket, said lower coupling hole being partially defined by a bottom edge for frictional engagement with the transverse face of the transverse body section of the bottom hook of one said fan bracket, the bottom edge defining said lower coupling hole and the top edge defining said retaining hole defining a second distance, said second distance being smaller than said first distance.

2. The fan bracket mounting structure as claimed in claim 1, wherein said retaining block is a wedge block.

3. The fan bracket mounting structure as claimed in claim 1, said at least one fan bracket is respectively molded from plastics; said base frame is made of metal.

4. The fan bracket mounting structure as claimed in claim 1, wherein the retaining block of each said fan bracket is spaced between the top protruding block and bottom hook of the respective fan bracket.

* * * * *